United States Patent [19]
Terasawa

[11] Patent Number: 5,950,075
[45] Date of Patent: *Sep. 7, 1999

[54] SEMICONDUCTOR DEVICE HAVING RECESSED GATE REGIONS AND METHOD OF MANUFACTURING THE SAME

[75] Inventor: Yoshio Terasawa, Katsuta, Japan

[73] Assignee: NGK Insulators, Ltd., Japan

[ * ] Notice: This patent is subject to a terminal disclaimer.

[21] Appl. No.: 08/955,818

[22] Filed: Oct. 22, 1997

Related U.S. Application Data

[62] Division of application No. 08/772,884, Dec. 24, 1996, Pat. No. 5,757,035, which is a continuation of application No. 08/483,590, Jun. 7, 1995, abandoned.

[30] Foreign Application Priority Data

Sep. 7, 1994 [JP] Japan .................................. 6-213647

[51] Int. Cl.$^6$ .................................................. H01L 21/332

[52] U.S. Cl. ........................... 438/133; 438/455; 257/170

[58] Field of Search ..................................... 438/133, 135, 438/136, 137, 138, 139, 140, 206, 209, 212, 455; 257/138, 142, 144, 147, 151, 152, 153, 170

[56] References Cited

U.S. PATENT DOCUMENTS

| | | | |
|---|---|---|---|
| 4,571,815 | 2/1986 | Baliga et al. | 438/137 |
| 4,587,712 | 5/1986 | Baliga | 438/137 |
| 4,829,348 | 5/1989 | Broich et al. | 257/153 |
| 4,984,049 | 1/1991 | Nishizawa et al. | 257/170 |
| 5,426,314 | 6/1995 | Nixhizawa et al. | 527/136 |
| 5,428,229 | 6/1995 | Niwayama et al. | 257/170 |
| 5,488,236 | 1/1996 | Baliga et al. | 257/132 |
| 5,702,962 | 12/1997 | Terasawa | 438/136 |

FOREIGN PATENT DOCUMENTS 7-45815  2/1995  Japan .

OTHER PUBLICATIONS

S. Wolf and R.N. Tauber, Silicon Processing for the VLSI Era; V.1–Process Tech., pp. 264–267, 1986.
Nikkei Electronics, vol. 1971.9.27 pp. 50–61 (1971).
J. Nishizawa et al., IEEE Trans on Electron Devices, vol. ED–22(4), pp. 185–197 (1975).
J. Nishizawa et al., Rev. de Physiquee Applique, T13, pp. 725–728 (1978).
J. Nishizawa et al., Technical Digest 1980 IEDM pp. 658–661 (1980).
J. Nishizawa et al., Analysis of Characteristics of Static Induction Thyristor, vols. ED81–7 & ED84–84, (1981).
M. Ishidoh et al., Advanced High Frequency GTO, Proc. ISPSD, pp. 189–194 (1988).
B.J. Baliga et al., The Evolution of Power Device Technology, IEEE Trans on Electron Devices, vol. ED–31, pp. 1570–1591, (1984).
M. Amato et al., Comparison of Lateral and Vertical DMOS Specific On–Resistance, IEDM Tech. Dig. pp. 736–739, (1985).
H. Mitlehner et al., A Novel 8kV Light–Trigger Thyristor with Over Voltage Self Protection, Proc. ISPSD, pp. 289–294 (1990).
B.J. Baliga, Modern Power Devices, John Wiley Sons, pp. 350–353, (1987).

*Primary Examiner*—Chandra Chaudhari
*Assistant Examiner*—Scott J. Hawranek
*Attorney, Agent, or Firm*—Parkhurst & Wendel, L.L.P.

[57] ABSTRACT

In a surface of a silicon substrate of one conductivity type, there are formed a plurality of depressions or recesses, gate regions of opposite conductivity type are formed at bottoms of respective recesses, gate electrodes are provided on respective gate regions, and an electrically conductive block is joined to the surface of the semiconductor substrate. Between the surface of the semiconductor substrate and the electrically conductive block a contact region having a high impurity concentration and/or an electrically conductive material layer may be provided in order to improve electrical and mechanical properties of the contact between the semiconductor substrate and the electrically conductive block. The gate region can have a high impurity concentration and a distance between a channel region and the electrically conductive block can be very small.

8 Claims, 8 Drawing Sheets

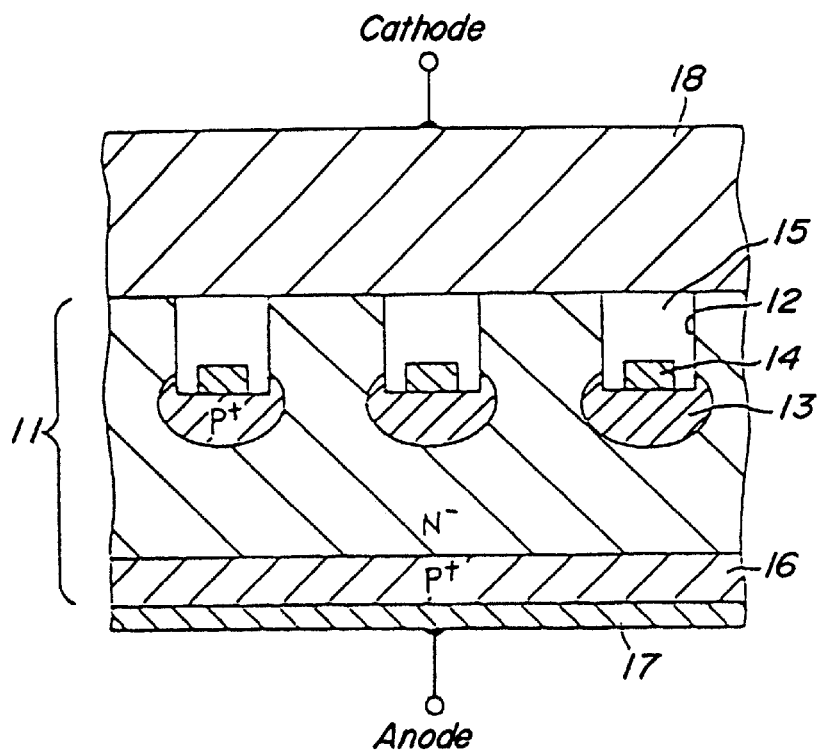
FIG_1
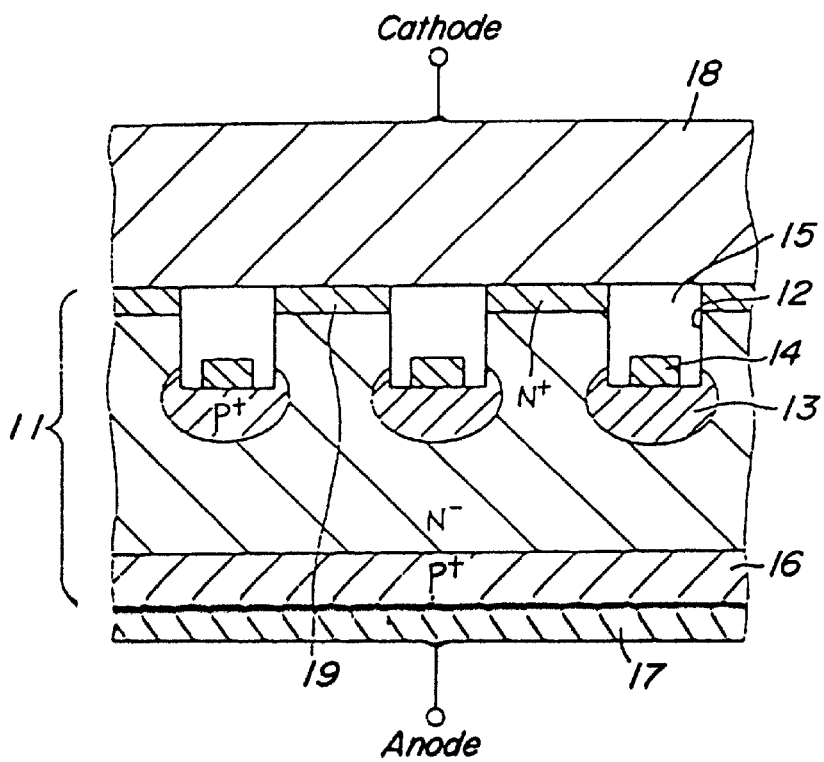
FIG_2

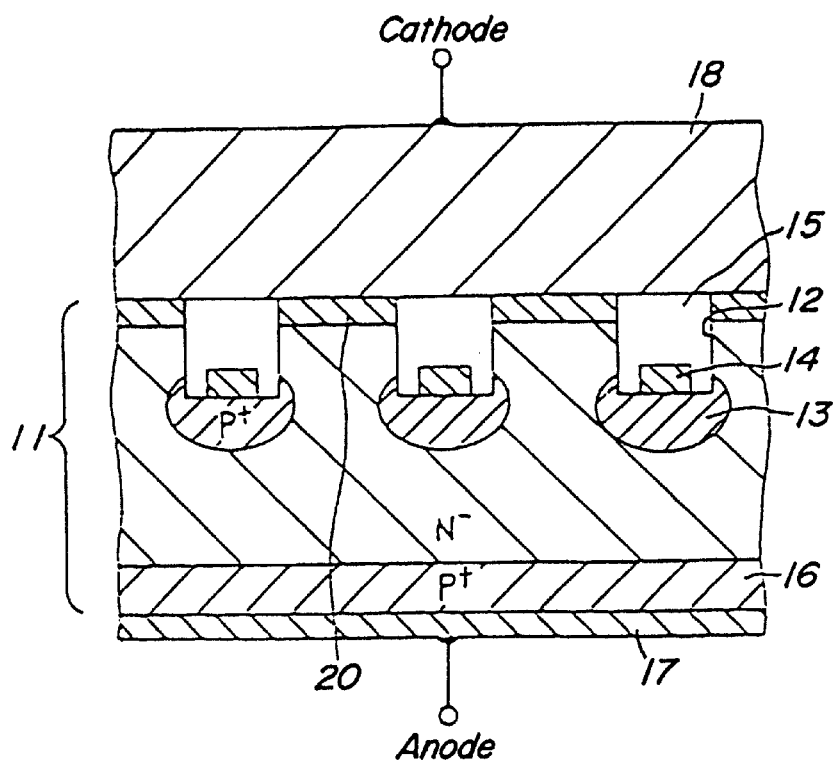
FIG_3
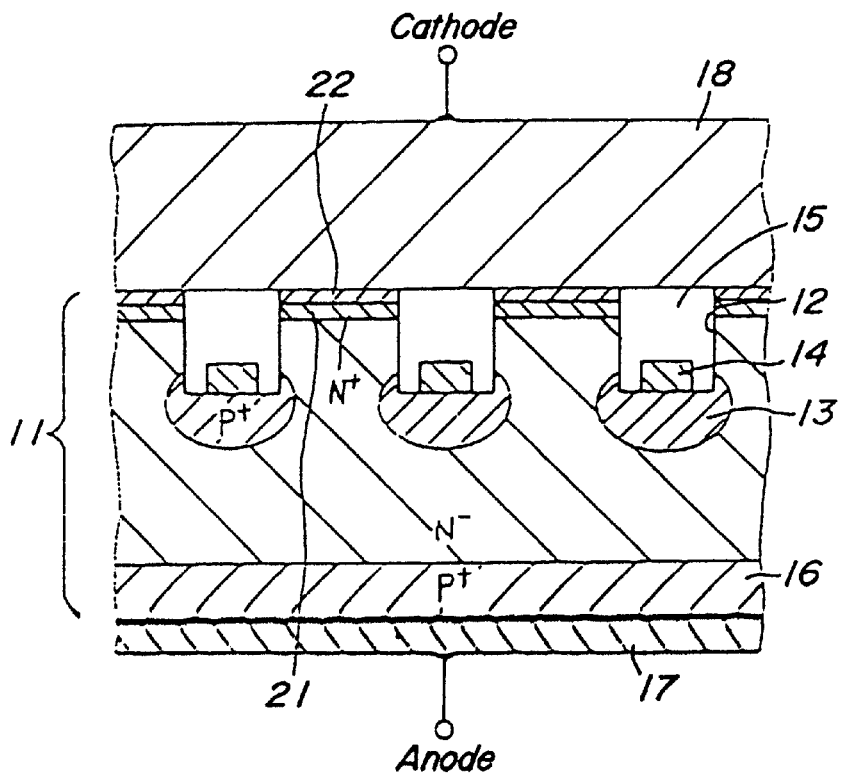
FIG_4

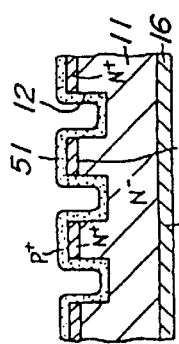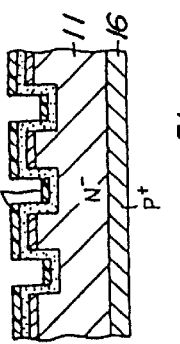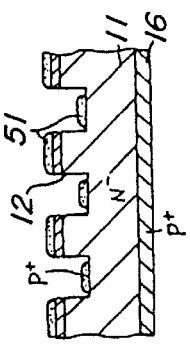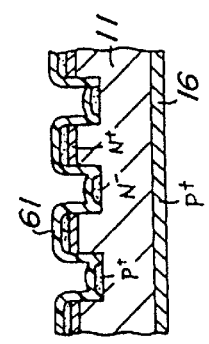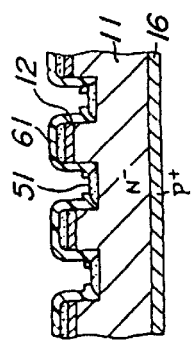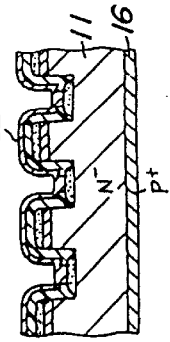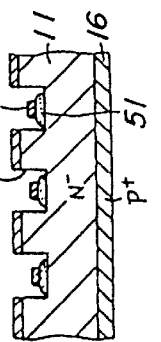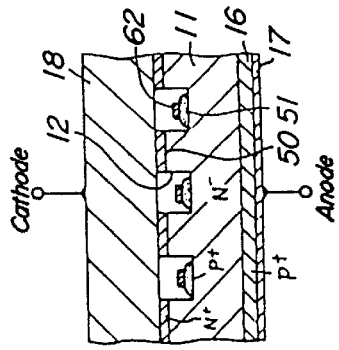
FIG.9A  FIG.9B  FIG.9C  FIG.9D  FIG.9E  FIG.9F  FIG.9G  FIG.9H  FIG.9I

FIG_10
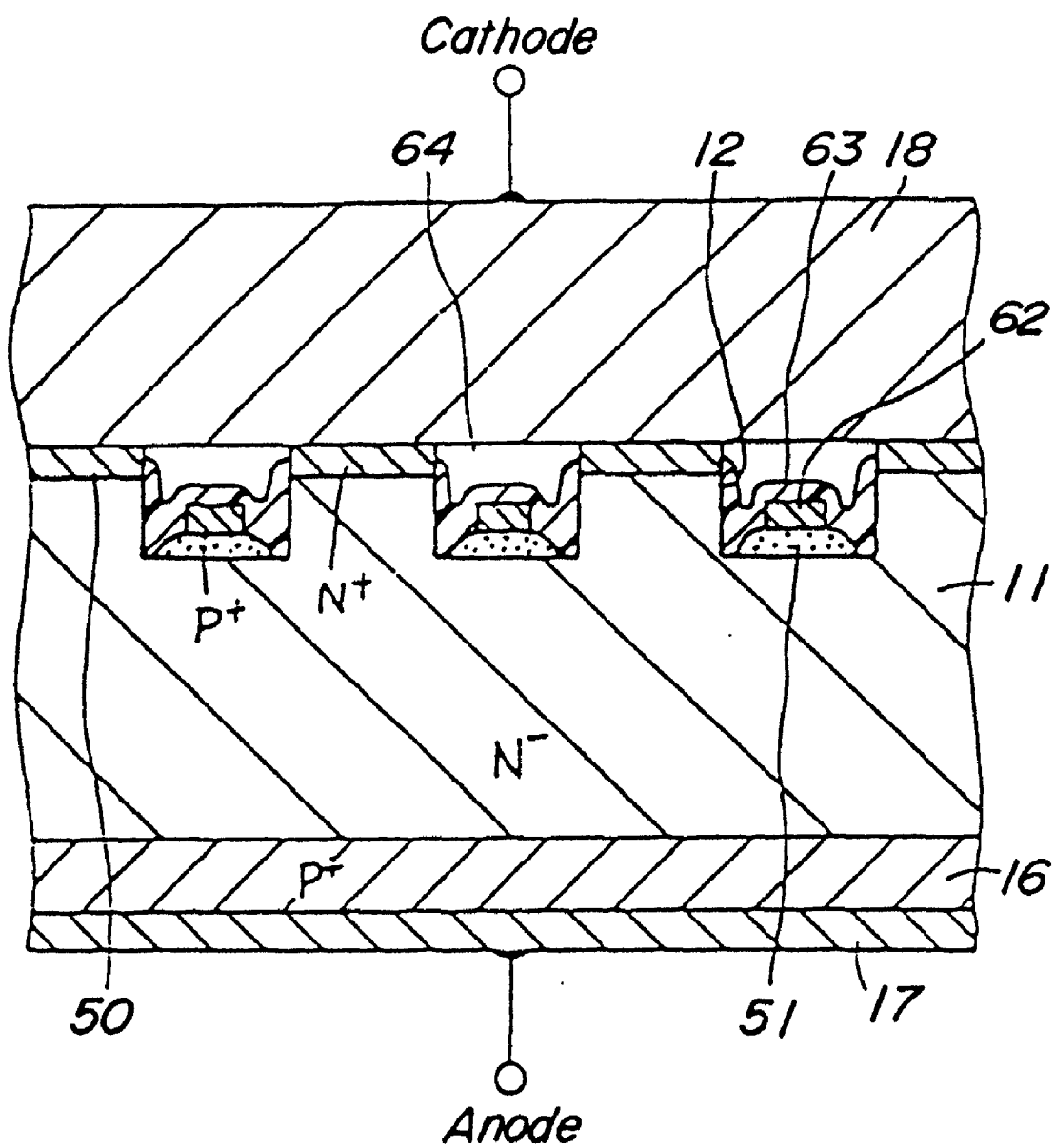

SEMICONDUCTOR DEVICE HAVING RECESSED GATE REGIONS AND METHOD OF MANUFACTURING THE SAME This is a Division of application Ser. No. 08/772,884 filed Dec. 24, 1996, now U.S. Pat. No. 5,757,035, which in turn is a continuation of application Ser. No. 08/483,590 filed Jun. 7, 1995 abandoned.

BACKGROUND OF THE INVENTION

1. Field of the Invention

The present invention relates to a semiconductor device, and particularly to a self-extinguish type semiconductor device such as a gate turn-off thyristor, static induction thyristor and static induction transistor. The present invention also relates to a method of manufacturing a semiconductor device.

2. Description of the Related Art

The above mentioned self-extinguish type semiconductor device such as gate turn-off thyristor (GTO thyristor) and static induction thyristor (SI thyristor) have been widely used as a power semiconductor device and have been described in the following publications:

1. Junichi Nishizawa, "High Power Vertical Type Junction FET having Triode Characteristics", Nikkei Electronics, Sep. 27, 1971, pp. 50–61

2. J. Nishizawa, T. Terasaki and J. Sibata, "Field-Effect Transistor versus Analog Transistor (Static Induction Transistor)", IEEE Trans. on Electron Device, ED-22(4), 185, 1975

3. J. Nishizawa and K. Nakamura, Physiquee Appliquee, T13, 725, 1978

4. J. Nishizawa and Y, Otsubo, Tech. Dig. 1980 IEDM, 658, 1980

5. J. Nishizawa, T. Ohmi, T. Sha and K. Mototani, Technical Report of Electron and Communication Society, ED81–84, 1981

6. M. Ishidoh, et al, "Advanced High Frequency GTO", Proc, ISPSD, 189, 1988

7. B. J. Baliga, et al, "The Evolution of Power Device Technology", IEEE Trans. on Electron Device, ED-31, 1570, 1984

8. M. Amato, et al, "Comparison of Lateral and Vertical DMOS Specific On-resistance", IEDM Tech. Dig., 736, 1985

9. B. J. Baliga, "Modern Power Device", John Wiley Sons, 350, 1987

10. H. Milehner, et al, "A Novel 8 kV Light-Trigger Thyristor with Over Voltage Self Protection", Proc. ISPSD, 289, 1990

For the self-extinguish type power transistors, there have been proposed a buried gate type GTO thyristor and a buried gate type SI thyristor, in which gate regions are formed in a surface of a semiconductor substrate and then an epitaxial layer is formed on the surface of the semiconductor substrate such that the gate regions are buried. In this case, a growth of the epitaxial layer has a substrate dependency. That is, crystal growth and impurity density distribution of the epitaxial layer formed on the gate region differ from those of the epitaxial layer formed on the surface of the semiconductor substrate. Due to such a substrate dependency of the epitaxial layer, it is difficult of obtain a semiconductor device having good properties. Further, the epitaxial growth is a process which requires a relatively long time period, so that the efficency of manufacturing such a buried gate type semiconductor device is low. Moreover, the conductivity type of a semiconductor region in the vicinity of the gate region is likely to be inverted. In order to mitigate the above mentioned drawbacks, there has been proposed a surface gate type structure, in which gate regions are formed in a surface of a semiconductor substrate. However, in such a surface gate type semiconductor device, a large gate reverse voltage could not be attained and thus a large current could not be interrupted.

In the known GTO thyristors, it is impossible to increase an impurity concentration of the gate region, and therefore a carrier drawing speed is low so that a turn-off loss is large and an operating frequency is low.

In order to overcome the above mentioned problems of the buried gate type semiconductor devices, there has been proposed a serration gate structure, in which relatively deep recesses are formed in a surface of a semiconductor substrate and gate regions are formed at bottoms of these recesses. However, it is rather difficult to form the deep recesses even by using a dry etching, and thus it is impossible to obtain a sufficiently high breakdown voltage. Moreover, a precision working for forming the deep recesses is liable to be complicated.

The inventor of the instant application has proposed, in U. S. patent application Ser. No. 08/407,023 as well as in a corresponding European Patent Application No. 94 921826.7 contact type or joined type semiconductor devices. In one type of these semiconductor devices, recesses or depressions are formed in a surface of a first semiconductor substrate, impurities are introduced into the semiconductor substrate from bottoms of the depressions to form gate regions each having a high impurity concentration, gate electrodes are formed on respective gate regions and a second semiconductor substrate is joined to the surface of the first semiconductor substrate. In another type, gate regions each having a high impurity concentration are formed in a surface of a first semiconductor substrate, gate electrodes are formed on respective gate regions, and a second semiconductor substrate having depressions formed in a surface thereof is joined to the surface of the first semiconductor substrate such that the gate electrodes are accommodated in respective depressions formed in the surface of the second semiconductor substrate. In these joined type semiconductor devices, the above mentioned various drawbacks caused by the epitaxial growth can be removed. Therefore, in a joined type GTO thyristor, the impurity concentration of the gate regions can be easily made high, and thus carriers can be drawn at a high speed so that the operating frequency can be raised. In the joined type SI thyristor, the gate regions having a high impurity concentration can be buried uniformly, a large area can be easily realized.

In the above mentioned joined type semiconductor devices, the manufacturing process can be effectively simplified, but a distance between a channel region radiating heat and an electrode having a function for dissipating the heat is long, so that a cooling could not be performed efficiently. This might result in a malfunction of the semiconductor device. Moreover, the gate structures are surrounded in the depressions formed in the surfaces of the first and/or second semiconductor substrates, and thus there exist vacant spaces above the gate structures. This results in a decrease in a mechanical strength and a decrease in cooling efficiency.

SUMMARY OF THE INVENTION

The present invention has for its object to provide a novel and useful semiconductor device, in which the above mentioned drawbacks of the known buried gate type and serration gate type semiconductor devices can be removed by adopting the joined structure and furthermore the above mentioned drawbacks of the joined structure can be effectively mitigated.

According to the invention, a semiconductor device includes a semiconductor substrate of one conductivity type with a first main surface provided with depressions and a second main surface opposed to the first main surface; a gate structure including semiconductor regions of an opposite conductivity type having a high impurity concentration and formed at the bottoms of the depressions; and an electrically conductive block joint to the first main surface of the semiconductor substrate.

In a preferable embodiment of the semiconductor device according to the invention, in the first main surface of the semiconductor substrate, there is formed a contact layer having a high impurity concentration. By providing such a contact layer, a property of a contact between the semiconductor substrate and the electrically conductive block can be improved and a contact resistance can be decreased and a mechanical property can be also improved.

In another preferable embodiment of the semiconductor device according to the invention, an electrically conductive layer is provided on the first main surface of the semiconductor substrate. The electrically conductive layer is preferably made of a same electrically conductive material as the electrically conductive block, but it may be made of a different electrically conductive material than the electrically conductive block. In this embodiment, a good contact between the semiconductor substrate and the electrically conductive block can be obtained and a contact resistance can be decreased. Particularly, when the electrically conductive layer is made of the same material as that of the electrically conductive block, they are subjected to similar plastic deformation during a heating process, and thus electrical and mechanical characteristics of the contact can be improved.

According to the invention, the electrically conductive block may be advantageously made of a material selected from the group consisting of gold, silver, copper, aluminum, molybdenum, beryllium bronze, diamond and silicon carbide. These electrically conductive materials may be preferably used together with a silicon substrate. Particularly, it is preferable to form the electrically conductive block by a composite structure of a first molybdenum layer and a second copper layer. In this case, molybdenum has a thermal expansion coefficient which is between a thermal expansion coefficient of silicon and a thermal expansion coefficient of copper, and therefore a channel region can be free from a stress upon joining the electrically conductive block to the silicon substrate and an electrically and mechanically stable contact can be obtained.

In the semiconductor device according to the invention, it is no longer necessary to perform the epitaxial growth after forming the gate structure, and therefore it is possible to form the gate regions having a high impurity concentration uniformly and stably. Furthermore, since the electrically conductive block is directly joined to the semiconductor substrate, a distance between the channel region and the electrically conductive block becomes shorter than that of the above mentioned prior application and heat generated in the channel region can be dissipated efficiently.

When the gate structure is formed in the depressions formed in the surface of the semiconductor substrate, the gate region can have a large cross section. Therefore, the gate resistance can be decreased and a current flowing through a channel region can be interrupted completely. When the gate structure is formed such that a vacant space is not existent in the depression, mechanical strength can be improved and cooling efficiency can be improved. Moreover, impurities could not be hardly introduced into the gate structure and device characteristics can be improved.

The present invention also relates to method of manufacturing the above mentioned semiconductor device according to the invention. According to the invention, a method of manufacturing a semiconductor device includes:

preparing a semiconductor substrate of one conductivity type having first and second main surfaces and an electrically conductive block having a surface;

forming depressions in the first main surface of the semiconductor substrate and diffusing opposite type of impurities into the second main surface of the semiconductor substrate to form an electrode region;

forming a semiconductor layer of opposite conductivity type at each of the bottoms of the depressions formed in the first main surface of the semiconductor substrate;

forming a first insulating film on the semiconductor layer at each of the bottoms of the depressions;

removing selectively a part of the semiconductor layer formed on an inner wall of each of the depressions except for the bottom to form a gate region in each of the depressions;

forming a second insulating film on the inner wall of each of the depressions; and joining the surface of the electrically conductive block to a portion of the first main surface of the semiconductor substrate which is exposed between adjacent gate regions.

In a preferable embodiment of the method according to the invention, prior to forming the depressions in the first main surface of the semiconductor substrate, a contact region of one conductivity type having a high impurity concentration is formed in the first main surface of the semiconductor substrate. Then, this contact region can improve the contact property.

According to a further aspect of the invention, a method of manufacturing a semiconductor device includes:

preparing a semiconductor substrate of one conductivity type having first and second main surfaces and an electrically conductive block having a surface;

forming depressions in the first main surface of the semiconductor substrate and diffusing opposite type impurities into the second main surface of the semiconductor substrate to form an electrode region;

forming a semiconductor layer of opposite conductivity type at each of the bottoms of the depressions formed in the first main surface of the semiconductor substrate;

forming an insulating film on the semiconductor layer at each of the bottoms of the depressions;

removing selectively a part of the semiconductor layer formed on an inner wall of each of the depressions except for the bottoms to form a gate region in each of the depressions;

forming an electrically good conductive gate electrode selectively on said gate region in each of the depressions; and joining the surface of the electrically conductive block to a portion of the first main surface of the semiconductor substrate which is exposed between adjacent gate regions.

According to a further aspect of the invention, a method of manufacturing a semiconductor device includes:

preparing a semiconductor substrate of one conductivity type having first and second main surfaces and an electrically conductive block having a surface;

forming depressions in the first main surface of the semiconductor substrate and diffusing opposite type impurities into the second main surface of the semiconductor substrate to form an electrode region;

introducing impurities of opposite conductivity type into the first main surface of the semiconductor substrate at each of the bottoms of the depressions to form a gate region of opposite conductivity type at each of the bottoms of the depressions;

forming an insulating film on said semiconductor layer at each of the bottoms of the depressions;

removing selectively a part of the insulating film to expose a part of the gate region in each of the depressions;

forming an electrically good conductive gate electrode selectively on the exposed part of the gate region in each of the depressions; and joining said surface of the electrically conductive block to a portion of the first main surface of the semiconductor substrate which is exposed between adjacent gate regions.

BRIEF DESCRIPTION OF THE DRAWINGS

FIG. 1 is a cross sectional view showing a first embodiment of the semiconductor device according to the invention;

FIG. 2 is a cross sectional view illustrating a second embodiment of the semiconductor device according to the invention;

FIG. 3 is a cross sectional view depicting a third embodiment of the semiconductor device according to the invention;

FIG. 4 is a cross sectional view representing a fourth embodiment of the semiconductor device according to the invention;

FIGS. 9A to 9I are cross sectional views representing successive steps for manufacturing the semiconductor device depicted in FIG. 7;

FIG. 10 is a cross sectional view showing an eighth embodiment of the semiconductor device according to the invention.

DESCRIPTION OF THE PREFERRED EMBODIMENTS

Figure 5:
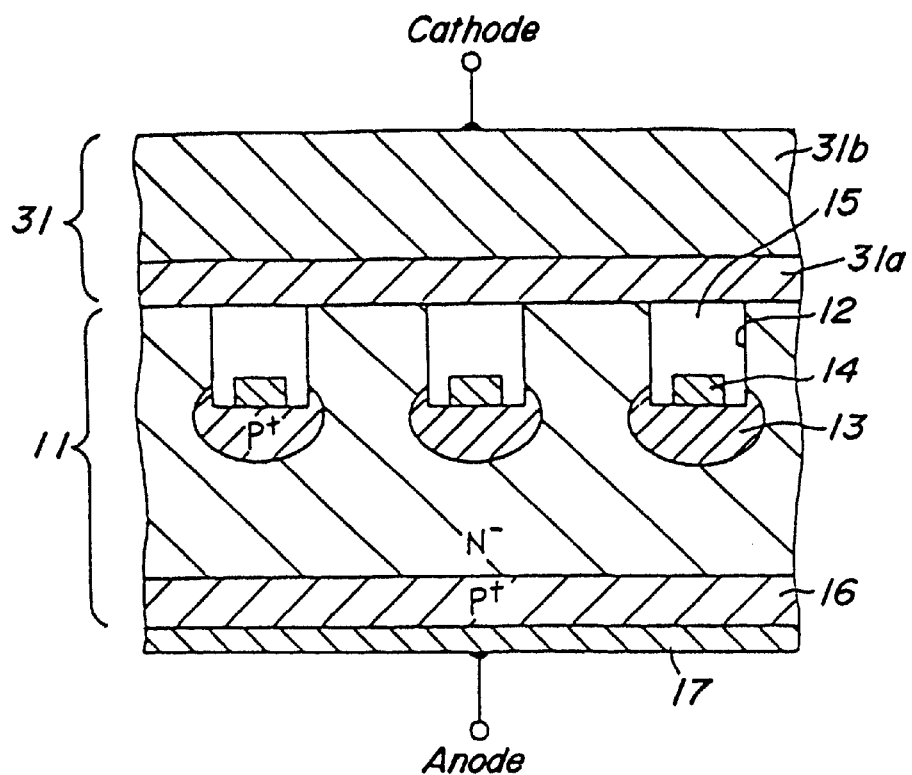
FIG. 5 is a cross sectional view depicting a fifth embodiment of the semiconductor device according to the invention.

FIG. 1 is a cross sectional view showing a first embodiment of the semiconductor device according to the invention. In the present embodiment, the semiconductor device is formed as a SI thyristor. In a first main surface of a semiconductor substrate 11 formed by an N⁻ silicon substrate having an N type impurity concentration of $10^{12}$ to $10^{16}$ atoms/cm³, there are formed a plurality of depressions or recesses 12 with the aid of a precision working. The recesses 12 have a depth not smaller than 10 μm and a width of 20–50 μm, and a distance between adjacent recesses is 3–20 μm. P type impurities are introduced into the semiconductor substrate 11 from the bottoms of the recesses 12 to form P⁺ gate regions 13 having a P type impurity concentration of $10^{17}$ to $10^{21}$ atoms/cm³. On the bottom surfaces of the recesses 12, there are formed gate electrodes 14 such that each gate electrodes is brought into contact with a respective gate regions 13. The gate electrodes 14 are made of an electrically good conductive material such as W, $WSi_2$, Mo and $MoSi_2$. In the present embodiment, in a recess 13 there is formed only a gate electrode 14 and a remaining portion of the recess constitutes a vacant space 15.

In a second main surface of the silicon substrate 11 opposing to the first surface, there is formed a P⁺ anode contact layer 16 having a P type impurity concentration of $10^{17}$–$10^{21}$ atoms/cm³ by introducing P type impurities into the second main surface of the silicon substrate. On this anode contact layer 16, an anode electrode 17 is formed by, for instance sputtering, vapor deposition or plating of aluminum.

In the present embodiment, an electrically conductive block 18 is joined to the first main surface of the semiconductor substrate 11. According to the invention, it is preferable to make the electrically conductive block 18 of a material selected from the group consisting of gold, silver, copper, aluminum, molybdenum, beryllium bronze, diamond and silicon carbide. These materials can be advantageously used for a silicon substrate. The electrically conductive block 18 may have a thickness of 0.3–30 mm. In the present embodiment, the electrically conductive block 18 is formed by a copper plate having a thickness of 10 mm. It should be noted that the electrically conductive block 18 made of copper serves as a cathode of the SI thyristor.

In the SI thyristor of the present embodiment, a distance between a channel region serving as a heat generating source, i.e. a semiconductor region interposed between adjacent gate regions 13 and the electrically conductive block 18 is very short, and thus heat generated in the channel region can be effectively conducted to the electrically conductive block 18 and is dissipated therethrough. In this case, in order to increase heating efficiency, a jacket may be provided in the electrically conductive block 18 and a coolant may flow through the jacket.

FIG. 2 is a cross sectional view showing a second embodiment of the semiconductor device according to the invention. Also in the present embodiment, the semiconductor device is formed as a SI thyristor. The present embodiment differs from the first embodiment shown in FIG. 1 only in that in the first main surface of the semiconductor substrate 11, there is formed an N⁺ contact region 19 having a high impurity concentration of $10^{17}$–$10^{21}$ atoms/cm³ and having a thickness of several tens Angstroms to several micronmeters. Then the recesses 12 are formed in this first main surface of the silicon substrate 11 such that the recesses extend beyond the contact layer 19 into a bulk of the silicon substrate 11. That is, a depth of the recess 12 is larger than a thickness of the contact region 19. After forming the gate electrodes 14, the electrically conductive block 18 serving as the cathode is joined to the first main surface of the silicon substrate 11.

In the present embodiment, therefore, the first main surface of the semiconductor substrate 11 comprises contact layer 19 having a high impurity concentration with such a structure it is possible to obtain a joined contact having properties and contact resistance can be decreased.

FIG. 3 is a cross sectional view depicting a third embodiment of the semiconductor device according to the invention. In the present embodiment, an electrically conductive material layer 20 having a thickness of 1–100 μm is formed on the first main surface of the semiconductor substrate 11 made of N⁻ silicon and the electrically conductive block 18 is joined to the electrically conductive layer 20. Also in the present embodiment, a contact resistance can be reduced. The electrically conductive material layer 20 has to be made of a material which constitutes an ohmic contact for the semiconductor substrate 11. It is particularly preferable to make the electrically conductive block 18 of a same or similar material as or to that of the electrically conductive layer 20. Then, plastic deformation occurs due to a contact of metals, and thus good electrical and mechanical contact can be obtained easily.

FIG. 4 is a cross sectional view showing a fourth embodiment of the semiconductor device according to the invention. Also in the present embodiment, the semiconductor device is formed as a SI thyristor. In the present embodiment, in the first main surface of the semiconductor substrate 11, there is formed N⁺ contact layer 21 having a high impurity concentration and having a thickness of several tens Angstroms to several micronmeters and an electrically conductive material layer 22 having a thickness of 1–100 μm is formed on the contact layer 21. After forming the gate structure, the electrically conductive block 18 is joined to the electrically conductive material layer 22. In the present embodiment, it is possible to obtain an excellent contact condition, because the contact is a metal contact and the highly doped contact layer 21 is interposed between the bulk of the semiconductor substrate 11 and the electrically conductive block 18.

FIG. 5 is a cross sectional view showing a fifth embodiment of the semiconductor device according to the invention. In the present embodiment, the semiconductor device is formed as a SI thyristor. An electrically conductive block 31 has a composite structure consisting of a first electrically conductive layer 31a and a second electrically conductive layer 31b. The first electrically conductive layer 31a is made of molybdenum and the second electrically conductive layer 31b is made of copper. A thermal expansion coefficient of molybdenum has a value between a thermal expansion coefficient of silicon and a thermal expansion coefficient of copper. That is, the thermal expansion coefficient of the copper is higher than that of the molybdenum and the thermal expansion coefficient of molybdenum is higher than that of the silicon substrate. Therefore, a generation of stress upon heating for joining the silicon substrate 11 and block 31 can be suppressed and a mechanically stable contact can be obtained.

Figure 6:
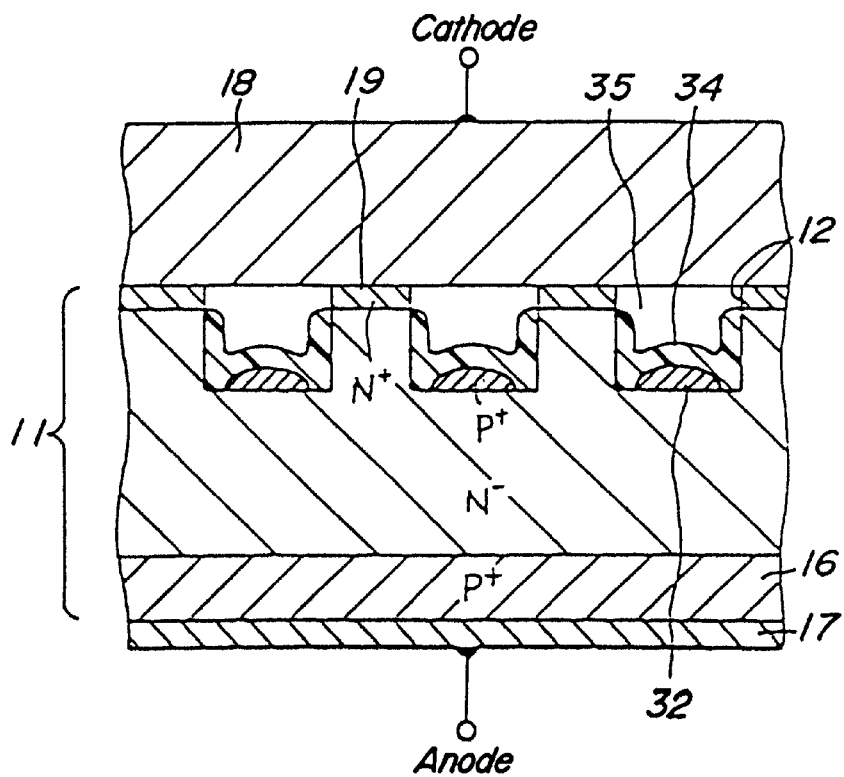
FIG. 6 is a cross sectional view representing a sixth embodiment of the semiconductor device according to the invention.

FIG. 6 is a cross sectional view illustrating a sixth embodiment of the semiconductor device according to the invention formed as a SI thyristor. In all the previously explained embodiments, a gate region is formed by introducing impurities into the semiconductor substrate from a bottom of a recess. In the present embodiment, gate regions 32 are formed on the bottoms of the recesses 12, and the gate regions 32 and remaining surfaces of the recesses 12 are covered with an insulating film 34 made of silicon oxide. After forming the insulating film 34 on the inner walls of the recesses 12, the electrically conductive block 18 is joined to the main surface of the semiconductor substrate 11 so that there are formed vacant spaces above the gate structure within the recesses 12. In the present embodiment, in order to decrease a contact resistance between the semiconductor substrate 11 and the electrically conductive block 18, in the main surface of the semiconductor substrate 11 there are formed N⁺ type contact layers 19.

Figure 7:
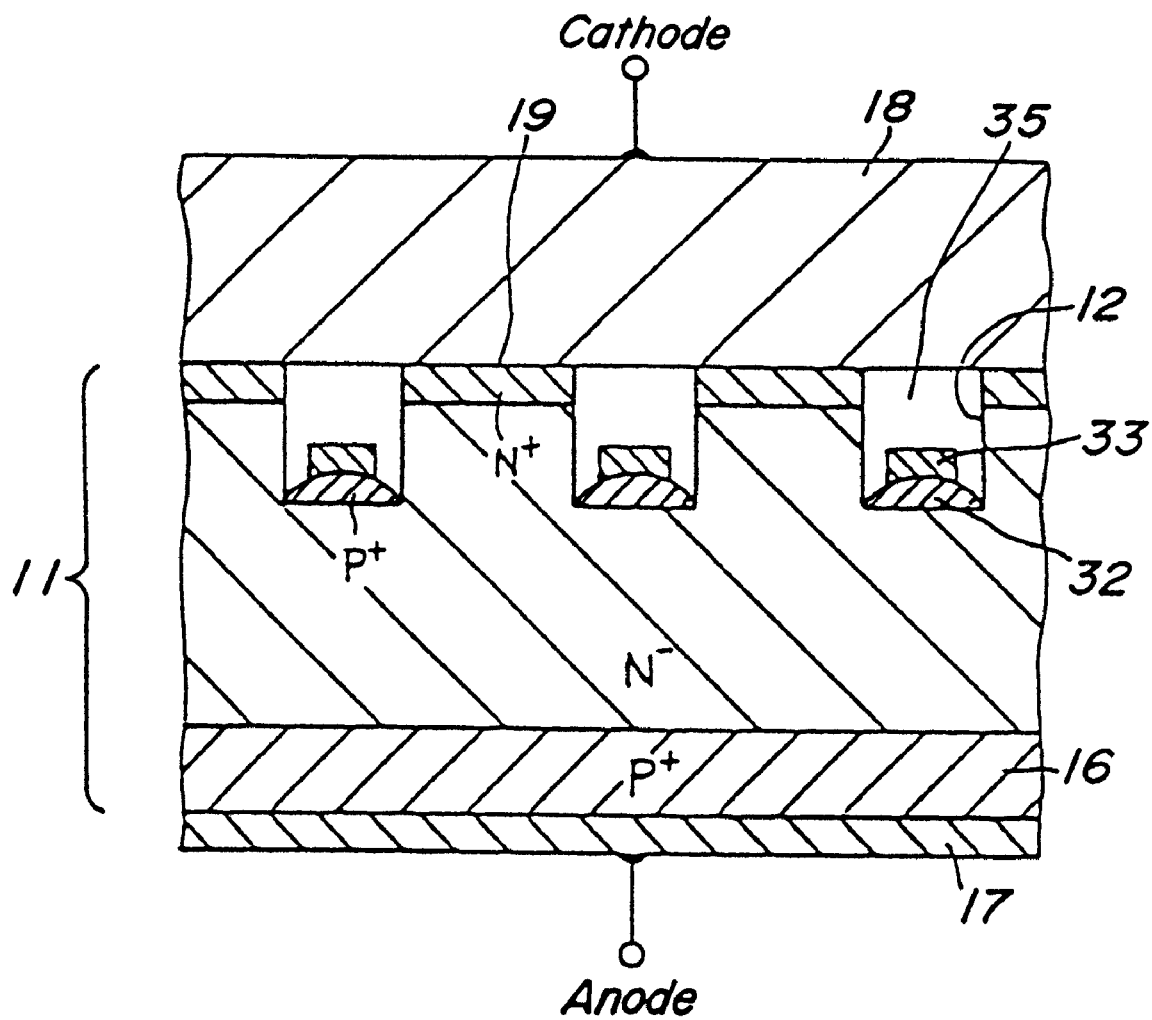
FIG. 7 is a cross sectional view representing a seventh embodiment of the semiconductor device according to the invention.

FIG. 7 is a cross sectional view depicting a seventh embodiment of the semiconductor device according to the invention. Also in the present embodiment, the semiconductor device is formed as a SI thyristor. In the first main surface of the N⁻ silicon substrate 11 there are formed the recesses 12, P⁺ poly-silicon film 32 is formed on the bottoms of the recesses 12, and then gate electrodes 33 are formed on respective poly-silicon films 32 such that the gate electrodes are not brought into contact with the inner walls of the recesses 12. After that, the electrically conductive block 18 is joined to to the main surface of the silicon substrate 11. Also in the present embodiment, the gate structure 32, 33 is formed partially in the recesses 12 so that there are formed vacant spaces 35 in respective recesses 21.

Now successive steps for manufacturing the semiconductor device illustrated in FIG. 6 will be explained with reference to FIGS. 8A to 8F.

Figure 8A:
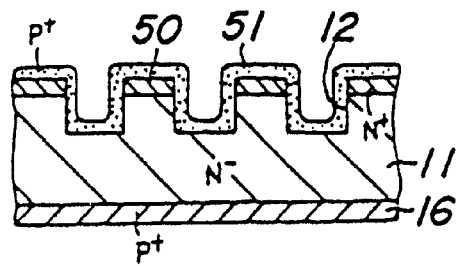
FIGS. 8A to 8F are cross section views illustrating successive steps for manufacturing the semiconductor device shown in FIG. 6.

At first, as shown in FIG. 8A, a first main surface of a N type silicon substrate 11 is doped with N type impurities to form an N⁺ contact region 50. Then, recesses 12 are formed in the first main surface of the silicon substrate 11 such that the recesses 12 penetrate through the contact regions 50. The other main surface of the silicon substrate 11 is doped with P type impurities to form P⁺ anode region 16. On the first main surface of the silicon substrate 11 there is further formed a P⁺ poly-silicon film 51. The P⁺ poly-silicon film 51 may be formed by depositing a film by using a mixture of $Si_2H_6$ (disilane)/$B_2H_6$ (diborane)/He and heating the silicon substrate 11 at a temperature of 575° C. under a pressure of 4 10⁻³ atm, and by annealing the thus deposited film at 1000° C. for thirty minutes.

Figure 8B:
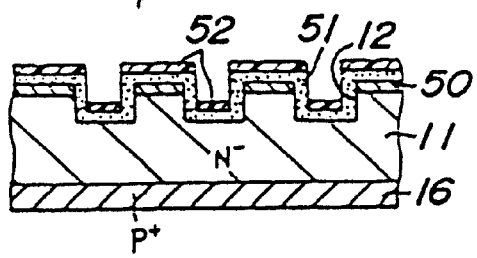

Next as illustrated in FIG. 8B, a silicon oxide film 52 is formed on the poly-silicon film 51 provided on the first main surface of the silicon substrate 11 as well as on the poly-silicon film 51 formed on the bottoms of the recesses 12 by ion beam sputtering.

Figure 8C:
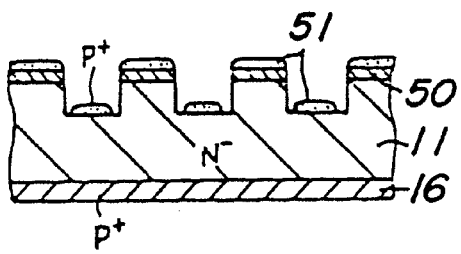
Figure 8D:
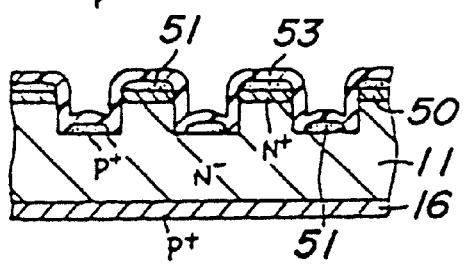
Figure 8E:
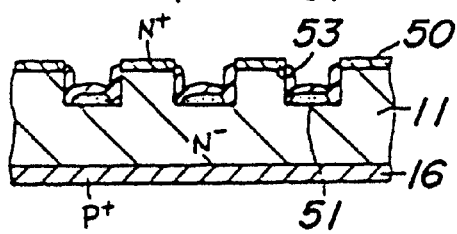
Figure 8F:
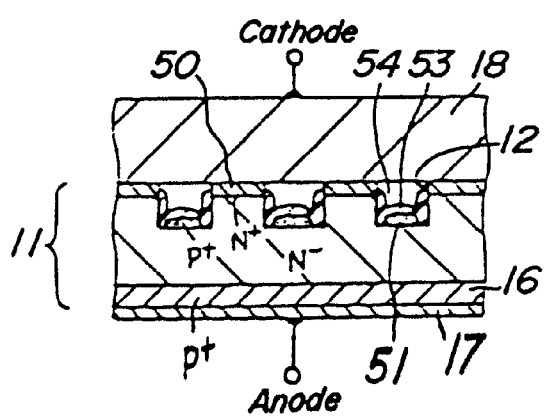

Then, etching is carried out to remove a part of the poly-silicon film 51 which is not covered with the silicon oxide film 52, i.e. a part of the poly-silicon 51 formed on the inner walls of the recesses 12 as shown in FIG. 8C. During this etching process, the silicon oxide film 52 is also removed. Next, an oxidation process is carried out to form an insulating film 53 made of silicon oxide as shown in FIG. 8D on the whole first surface of the silicon substrate 11. Then, parts of the poly-silicon film 51 and insulating film 52 provided on the first main surface of the silicon substrate 11 are removed by polishing to expose the contact region 50 as depicted in FIG. 8E. During this polishing process, a part of the insulating film 53 formed in the recesses 12 is also removed. Finally, an electrically conductive block 18 is joined to the first main surface of the silicon substrate 11 through the contact region 50 as illustrated in FIG. 8F, and on the P⁺ anode region 16 there is formed an anode electrode 17. In this manner, it is possible to obtain the gate structure, in which the P⁺ poly-silicon film 51 serving as the gate regions is formed in the recesses 12, the poly-silicon film 51 is covered with the insulating film 53 and the remaining portions of the recesses 12 form the vacant spaces 54. In this manner, the Si thyristor shown in FIG. 6 can be manufactured.

Next successive steps of another embodiment of the method of manufacturing the semiconductor device shown in FIG. 7 will be explained with reference to FIGS. 9A to 9I.

At first, as illustrated in FIG. 9A, a first main surface of an N type silicon substrate 11 is doped with a large amount of N type impurities to form an N⁺ contact region 50. Then, in the first main surface of the silicon substrate 11 there are formed recesses 12 having a depth larger than a thickness of the contact region 50. In a second surface of the silicon substrate 11 there is formed a P⁺ anode region 16 by introducing a large amount of P type impurities into the second main surface of the silicon substrate 11. Further a P⁺ poly-silicon layer 51 is formed on the first main surface of the silicon substrate 11. Next, as shown in FIG. 9B, a silicon oxide film 52 is deposited, by ion beam sputtering, on the first main surface of the silicon substrate 11 as well as on the P⁺ poly-silicon layer 51 formed on the bottoms of the recesses 12. Then, etching is carried out by using the silicon oxide film 52 as a mask to remove a part of the poly-silicon layer 51 formed on side walls of the recesses 12 as depicted in FIG. 9C. During this etching process, the silicon oxide film 52 is also etched away.

Next, as shown in FIG. 9D, a resist 61 is uniformly applied on the first main surface of the silicon substrate 11, and then parts of the resist 61 applied on the poly-silicon film 51 formed on the bottoms of the recesses 12 are selectively removed as shown in FIG. 9E. Then, a high melting point metal film 62 such as W and Mo is deposited uniformly on the first main surface of the silicon substrate 11 as depicted in FIG. 9F. Next, a lift-off process is performed to leave only a part of the metal film 62 applied on the poly-silicon film 51 provided on the bottoms of the recesses 12 as depicted in FIG. 9G, and after that a polishing process is carried out to expose the contact region 51 as illustrated in FIG. 9H. Finally, an electrically conductive block 18 is joined to the exposed surfaces of the contact regions 50 as shown in FIG. 9I and an anode electrode 17 is formed on the P⁺ anode region 16. In this manner, the SI thyristor having the structure shown in FIG. 7 is manufactured.

FIG. 10 is a cross sectional view showing an eighth embodiment of the semiconductor device according to the invention. In the present embodiment, the semiconductor device is formed as a SI thyristor. Also in the present embodiment, the gate structure is formed by a poly-silicon film 51 provided on bottoms of recesses 12 formed in a first main surface of a silicon substrate 11, a high melting point metal film 62 applied on the poly-silicon film 51, and an insulating film 63 formed on the metal film 62 as well as the poly-silicon film 51 like the embodiment illustrated in FIG. 7. In the present embodiment, the gate structure 51, 62 and 63 is not formed to fill the recesses 12, so that there is formed vacant space 64 in the recesses 12.

Figure 11A:
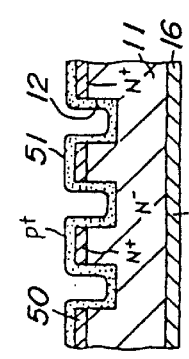
FIGS. 11A to 11J are cross sectional views showing successive steps for manufacturing the semiconductor device illustrated in FIG. 10.
Figure 11B:
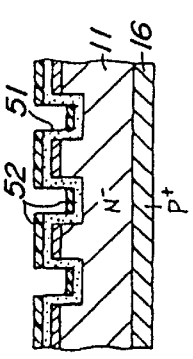
Figure 11C:
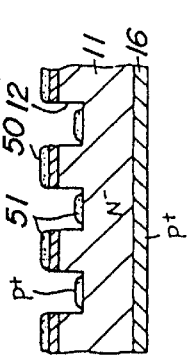
Figure 11D:
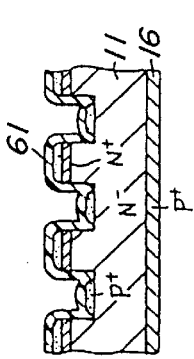
Figure 11E:
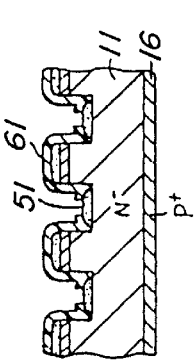
Figure 11F:
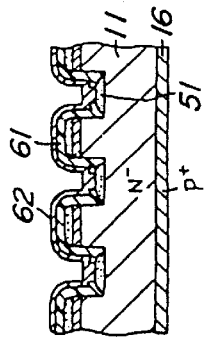
Figure 11G:
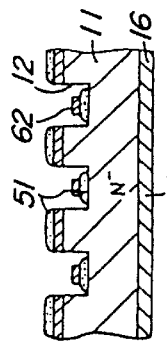
Figure 11H:
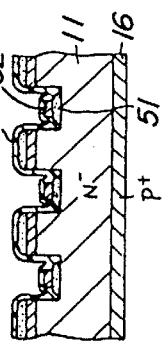
Figure 11I:
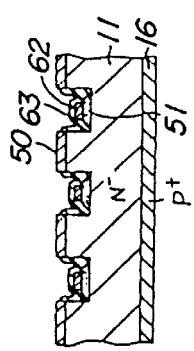
Figure 11J:
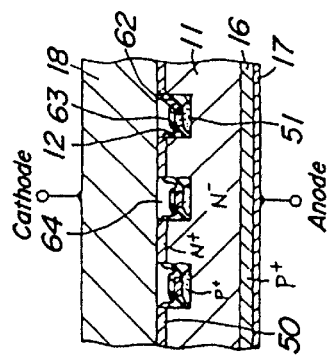

FIGS. 11A to 11J are cross sectional views showing successive steps for manufacturing the SI thyristor depicted in FIG. 10.. Steps illustrated in FIGS. 11A to 11G are identical with those shown in FIGS. 9A to 9G. By the step of FIG. 11G, a P⁺ poly-silicon film 51 and a high melting point metal film 62 have been formed on bottoms of recesses 12 formed in a first main surface of a silicon substrate 11. In the present embodiment, in a next step represented in FIG. 11H, an insulating film 63 made of silicon oxide is formed uniformly on the first main surface of the silicon substrate 11 by CVD using TEOS as a raw material gas. This insulating film 63 may be formed at a temperature of 4000° C. under the atmospheric pressure by means of ozone ($O_3$) oxidation of TEOS (tetra ethoxysilane). Next, polishing is performed to expose a contact region 50 as shown in FIG. 11I, and then an electrically conductive block 18 is joined to the exposed surface of the contact region 50 and an anode electrode 17 is applied on the the anode region 16 as illustrated in FIG. 11J. In this manner, the SI thyristor shown in FIG. 10 can be manufactured.

The present invention is not limited to the embodiments so far explained, but many modifications and alternations may be conceived by those skilled in the art within the scope of the present invention. For instance, in the above mentioned embodiments, the semiconductor device is formed as a SI thyristor, but according to the invention, the semiconductor device may be formed as a GTO thyristor and SI transistor. Moreover, in the above embodiments, the semiconductor substrate and the electrically conductive block are joined together by heating them. However, according to the invention, these two members may be brought into contact with each other. In the above explained SI thyristors, the anode region is formed by P type semiconductor region, but according to the invention, the anode region may be formed by an N type semiconductor region. Furthermore, in the case of SI transistor, an emitter or drain region may be formed by an N type semiconductor region.

As explained above in detail, in the semiconductor device according to the invention, the electrically conductive block is joined on the surface of the semiconductor substrate in which the recesses are formed, and therefore a distance between a heat generating channel region and the electrically conductive block can be shortened, and thus heat generated in the channel region can be-effectively dissipated through the electrically conductive block and the cooling can be performed efficiently.

When a highly doped contact region is formed in the first surface of the semiconductor substrate and/or an electrically conductive material layer is formed on the first main surface of the semiconductor substrate, the semiconductor substrate and the electrically conductive block can be joined together in an electrically and mechanically good condition.

Moreover, in the present invention, when the gate structure is provided in the recess formed in the first main surface of the semiconductor substrate, it is possible to decrease a gate resistance, to interrupt a large current and to operate at a high frequency. Furthermore, in this case, when the gate structure is formed such that the recess is completely filled with the gate structure, the gate region can be effectively prevented from being contaminated and the device property can be prevented from being deteriorated,.and the heat dissipation can be further improved, because a heat can transmit through the gate structure.

What is claimed is:

1. A method of manufacturing a semiconductor device comprising the steps of:

preparing a semiconductor substrate of one conductivity type having a first and second main surfaces and an electrically conductive block having a surface;

forming depressions in said first main surface of the semiconductor substrate and diffusing opposite type impurities into the second main surface of the semiconductor substrate to form an electrode region;

forming a semiconductor layer of opposite conductivity type at each of bottoms of said depressions formed in the first main surface of the semiconductor substrate;

forming a first insulating film on said semiconductor layer at each of the bottoms of the depressions;

removing selectively a part of the semiconductor layer formed on an inner wall of each of the depressions except for the bottom to form a gate region in each of the depressions;

forming a second insulating film on the inner wall of each of the depressions; and joining said surface of the electrically conductive block to a portion of the first main surface of the semiconductor substrate which is exposed between adjacent gate regions.

2. A method according to claim 1, wherein prior to forming the depression in the first main surface of the semiconductor substrate, a contact region of one conductivity type having a high impurity concentration is formed in the first main surface of the semiconductor substrate.

3. A method of manufacturing a semiconductor device comprising the steps of:

preparing a semiconductor substrate of one conductivity type having a first and second main surfaces and an electrically conductive block having a surface;

forming depressions in said first main surface of the semiconductor substrate and diffusing opposite type impurities into the second main surface of the semiconductor substrate;

forming a semiconductor layer of opposite conductivity type at each of bottoms of said depressions formed in the first main surface of the semiconductor substrate;

forming an insulating film on said semiconductor layer at each of the bottoms of the depressions;

removing selectively a part of the semiconductor layer formed on an inner wall of each of the depressions except for the bottoms to form a gate region in each of the depressions;

forming an electrically good conductive gate electrode selectively on each of said gate regions in the depressions; and joining said surface of the electrically conductive block to a portion of the first main surface of the semiconductor substrate which is exposed between adjacent gate regions.

4. A method according to claim 3, wherein after selectively forming said electrically good gate electrodes on the gate regions and prior to joining said electrically conductive block to the semiconductor substrate, a second insulating film is formed on the inner wall of each of the depressions.

5. A method according to claim or 3, wherein prior to forming the depression in the first main surface of the semiconductor substrate, a contact region of one conductivity type having a high impurity concentration is formed in the first main surface of the semiconductor substrate.

6. A method of manufacturing a semiconductor device comprising the steps of:

preparing a semiconductor substrate of one conductivity type having a first and second main surfaces and an electrically conductive block having a surface;

forming depressions in said first main surface of the semiconductor substrate and diffusing opposite type impurities into the second main surface of the semiconductor substrate;

introducing impurities of opposite conductivity type into the first main surface of the semiconductor substrate at each of bottoms of said depressions to form a gate region of opposite conductivity type at each of the bottoms of the depressions;

forming an insulating film on said semiconductor layer at each of the bottoms of the depressions;

removing selectively a part of the insulating film to expose a part of the gate region in each of the depressions;

forming an electrically good conductive gate electrode selectively on said exposed part of the gate region in each of the depressions; and joining said surface of the electrically conductive block to a portion of the first main surface of the semiconductor substrate which is exposed between adjacent gate regions.

7. A method according to claim 6, wherein said electrically conductive gate electrode is made of a metal.

8. A method according to claim 6, wherein said electrically conductive gate electrode is made of a metal selected from the group consisting of W, $WSiO_2$, Mo and $MoSiO_2$.

* * * * *